United States Patent
Numasawa

[19]

[11] Patent Number: 6,144,612
[45] Date of Patent: Nov. 7, 2000

[54] ADDRESS DECODER FOR A SYNCHRONOUS TYPE MEMORY CAPABLE OF PREVENTING MULTI-WORDLINE SELECTION

[75] Inventor: Kazuo Numasawa, Kanagawa, Japan

[73] Assignee: NEC Corporation, Tokyo, Japan

[21] Appl. No.: 09/505,779

[22] Filed: Feb. 17, 2000

[30] Foreign Application Priority Data

Feb. 19, 1999 [JP] Japan .................................. 10-040979

[51] Int. Cl.[7] ................................ G11C 8/10; G11C 8/20
[52] U.S. Cl. ............... 365/230.06; 365/233; 365/230.08; 326/106; 326/108; 326/105
[58] Field of Search .............................. 365/230.06, 233, 365/230.08; 326/105, 106, 108

[56] References Cited

U.S. PATENT DOCUMENTS

| | | | |
|---|---|---|---|
| 5,305,277 | 4/1994 | Derwin et al. | 365/230.02 |
| 5,566,123 | 10/1996 | Freidin et al. | 365/230.05 |
| 5,631,577 | 5/1997 | Freidin et al. | 326/40 |
| 5,959,936 | 9/1999 | Seo et al. | 365/233 |

FOREIGN PATENT DOCUMENTS 9-265782  10/1997  Japan ............................ G11C 11/413

*Primary Examiner*—Andrew Q. Tran
*Attorney, Agent, or Firm*—McGinn & Gibb, P.C.

[57] ABSTRACT

Address decoder of the present invention includes a latch circuit for latching an address signal, a logical circuit for decoding output signal from the latching circuit and a decoding circuit for decoding an output signal from the logical circuit. The address signals are inputted to the latch circuit during a time period in which a clock signal is at a first level and latched during a time period in which the clock signal is at a second level. The logical circuits unconditionally initialize the output signal from the latch circuit when the clock signal being at first level.

12 Claims, 7 Drawing Sheets

ADDRESS DECODER FOR A SYNCHRONOUS TYPE MEMORY CAPABLE OF PREVENTING MULTI-WORDLINE SELECTION

BACKGROUND OF THE INVENTION

1. Field of the Invention

The present invention relates to an address decoder, and especially to an address decoder for a semiconductor memory device of the synchronous type, and which includes a latching circuit for latching an address signal in response to a predetermined clock signal, and a decoding circuit for the latched address signal.

2. Description of the Related Art

Conventionally, a synchronous type static RAM (synchronous type SRAM) in which priority is given to a number of transistors, is constituted as shown by FIG. 5.

In FIG. 5, address signals S and S' are latched by a latching circuit (Latch) 100 in synchronism with a clock signal T. A group U of signals which are output signals from the latching circuit 100, are decoded by decoding circuits (decoder) 110 and the clock signal T is transmitted to NAND circuits (NAND gates) 110a of the decoders 110 to prevent "multiword".

In this case, when the clock signal T arrives at the NAND gates 110a of the decoders 110 before the address signals S and S' arrive at the NAND gates 110a of the decoders 110, "multiword" is caused. Therefore, generally, the NAND gate 110a of the decoder 110 must be supplied the clock signal T which is delayed through the delaying circuit 120.

In this case, the "multiword" signifies that a plurality of WORD lines are simultaneously selected and a selected state of the WORD lines are at "High" level.

Accordingly, as a normal memory constitution, the multiword is prevented by constructing a logic design in which only one of a total of the WORD lines is brought into the "High" level.

As shown by FIG. 6, WORD lines V, W, X and Y are connected to transfer gates 130a through 160a which is connected respectively memory cell 130 through 160.

In this case, when the memory cell 130 stores "High" level and the memory cell 160 stores "Low" level, and the WORD line V and Y cause the multiword, the "High" level of the memory cell 130 and the "Low" level of the memory cell 160 collide with each other and as a result, stored data of either of them is broken.

Accordingly, in the synchronous type SRAM, the multiword is a phenomenon which must never be caused and some measure of avoiding the multiword is needed.

Next, conventionally, in designing a synchronous type SRAM in which priority is given to the characteristic, there has been used a constitution shown by FIG. 7 disclosed in Japanese Laid-Open Patent Application No. 9-265782.

According to a decoder 200 having latch function, a decoder unit 210 and a latch unit 220 are integrally constituted, and the decoder unit 210 is constituted by an NAND gate 210a and an inverter 210b.

In the meantime, the latch unit 220 is constituted of a first group of transmission gates 220a and 220b and a second group of transmission gates 220c and 220d.

The respective groups of transmission gates 220a through 220d comprise PMOSs and NMOSs and are controlled to ON/OFF by supplying outside clocks to gates thereof.

Thereby, two stages of inverters used for inside address signals are reduced, inside address signals are constituted by high-speed formation, a setup margin for an inner clock is secured and high frequency operation is made possible.

The following problems are posed according to the conventional address decoder, mentioned above.

In the case of the former, a time period from when an address signal is set to when data is outputted, is dependent on a delay time period of the delay gate 120. Because the clock signal T is retarded by the delay gate 120 to when the address signals S and S' arrive at the NAND gates 110a of the decoders 110.

Further, in setting the delay time period at the delay gate 120, the delay time needs to be set to include a margin to some degree. Consequently, although the number of transistors are restrained to be small, the time period from when the address signals are set to when the data is outputted is increased. That is, the frequency of the clock signal T is restrained and accordingly, high speed formation of the synchronous SRAM is hindered.

In the meantime, in the case of the latter, although the high speed formation of the synchronous type SRAM can be realized. However, since the decoder unit and the latch unit 220 are integrated and accordingly, the larger a storage capacity, the mores an overhead of an area is produced. That is, the number of transistors is increased.

Further, when power supply is turned on, there is a case in which a plurality of outputs of the NAND gates 210a are selected to be brought into the "High" state. In the worst case, there is a concern in which large current flows until the clock is changed to thereby be broken transistors. Consequently, an initializing circuit needs to provide at an output portion of the NAND gate 210a. This also results in an increase in the number of transistors.

Accordingly, the design can only be carried out by giving priority to either of the number of transistors and the characteristic and it has been very difficult to reduce the number of transistors without being accompanied by a deterioration in the characteristic.

SUMMARY OF THE INVENTION

Accordingly, it is an object of the present invention to provide an address decoder capable of reducing a number of transistors without being accompanied by a deterioration in the characteristic.

An address decoder for synchronous type memory according to the present invention includes a plurality of initializing circuits for generating initialized signals irrespective of a plurality of address signals or outputting the address signals in response to a clock signal, and a plurality of decoding circuits connected to the initializing circuits, and for selecting one of a plurality of word lines. Further, the decoding circuits selects none of the word lines while the decoding circuit is supplied the initialized signals.

DETAILED DESCRIPTION OF THE PREFERRED EMBODIMENTS

Figure 1:
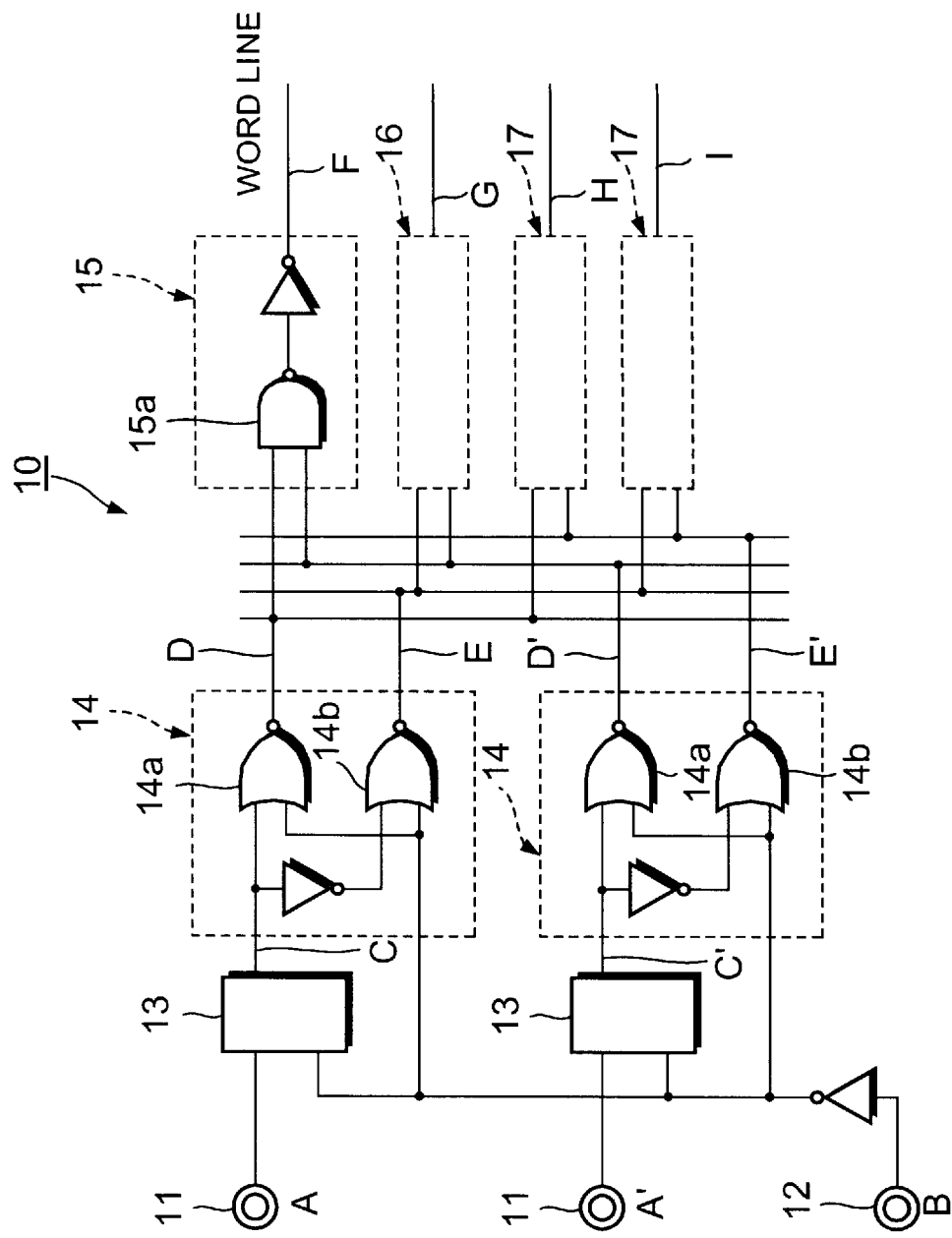
FIG. 1 is a block diagram showing an outline constitution of an address signal decoding apparatus according to an embodiment.

The preferred embodiments of the present invention will be described in detail hereinafter with reference to the accompanying drawings:

FIG. 1 is a block diagram showing an outline constitution of a, address signal decoding apparatus according to an embodiment of the present invention.

An address signal decoding apparatus 10 is provided with address signal input terminals 11 for inputting address signals A and A', clock signal input terminal 12 for inputting the clock signal B, and latching circuits 13 which are supplied with the address signals and the clock signal. The address signal decoding apparatus 10 inputs the address signals A and A' inputted from the address signal input terminals 11 in synchronism with the clock signal B inputted from the clock signal input terminal 12.

Logical circuits 14 are connected to output of the latching circuits 13 and the clock signal input terminal 12. The logical circuits 14 input latch output signals C and C' from the latching circuits 13 and output logical circuit output signals D, E, D' and E' in accordance with a level state of the clock signal B.

That is, the latching circuits 13 inputs the address signals A and A' during a time period in which the clock signal B is brought into "Low" level and latches the address signals A and A' during a time period in which the clock signal B is brought into "High" level. In this case, the "Low" period indicates a low level state according to the present invention and the "High" period indicates a high level state relative to the low level state.

Further, the logical circuits 14 are circuits of establishing logics between the latch output signals C and C' and the clock signal B. During "Low" period of the clock signal B, the logical circuits are unconditionally initialized to output "Low" level, during "High" period of the clock signal B, the logical circuits output the latch output signals C and C'.

Further, decoders 15 through 18 are connected to output sides of the logical circuits 14. The decoders 15 through 18 decode signals D, E, D' and E' and activate one of WORD lines F, G, H and I.

Figure 5:
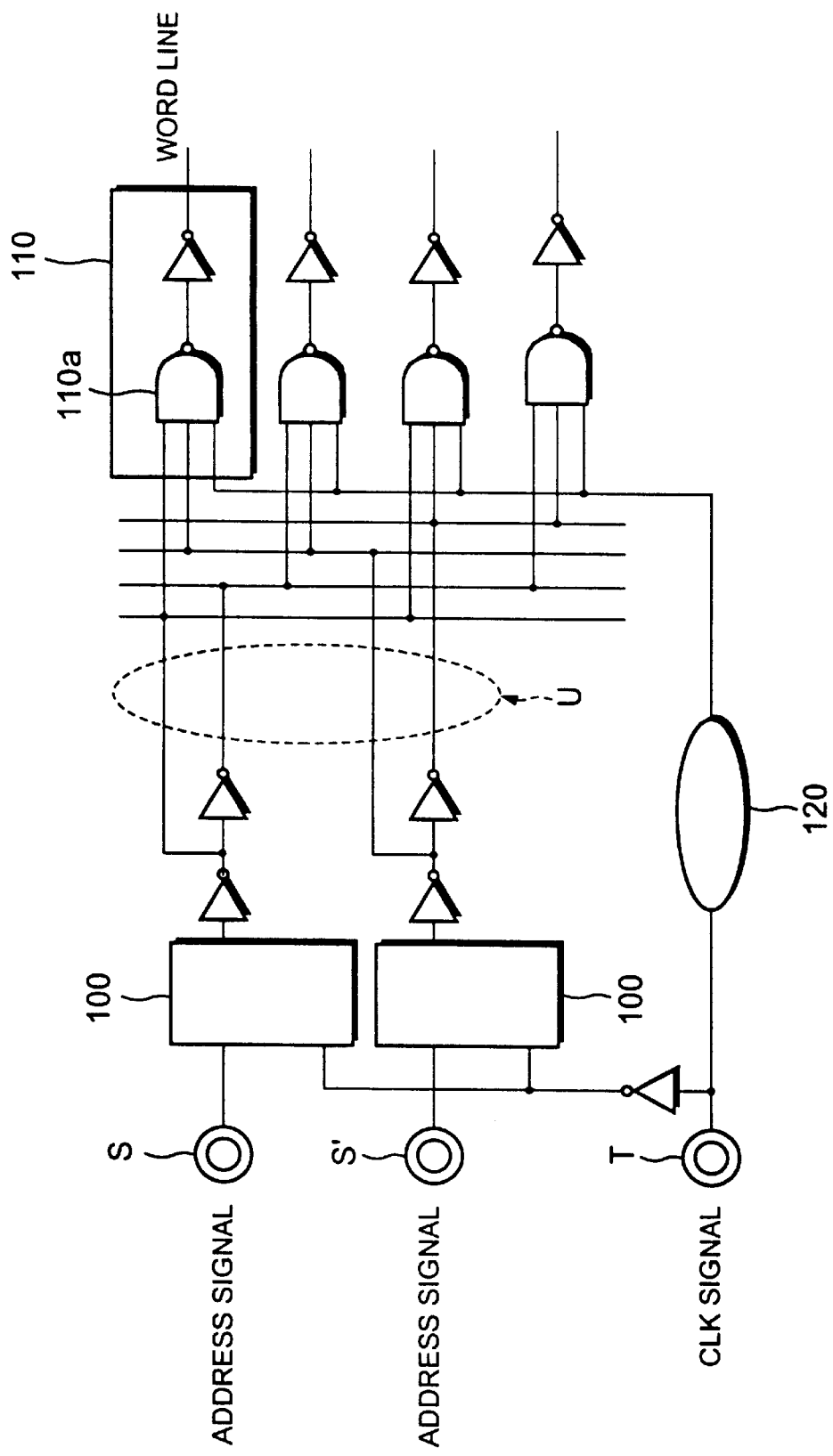
FIG. 5 is a block diagram showing a circuit constitution of a conventional example in which priority is given to a number of transistors.
Figure 6:
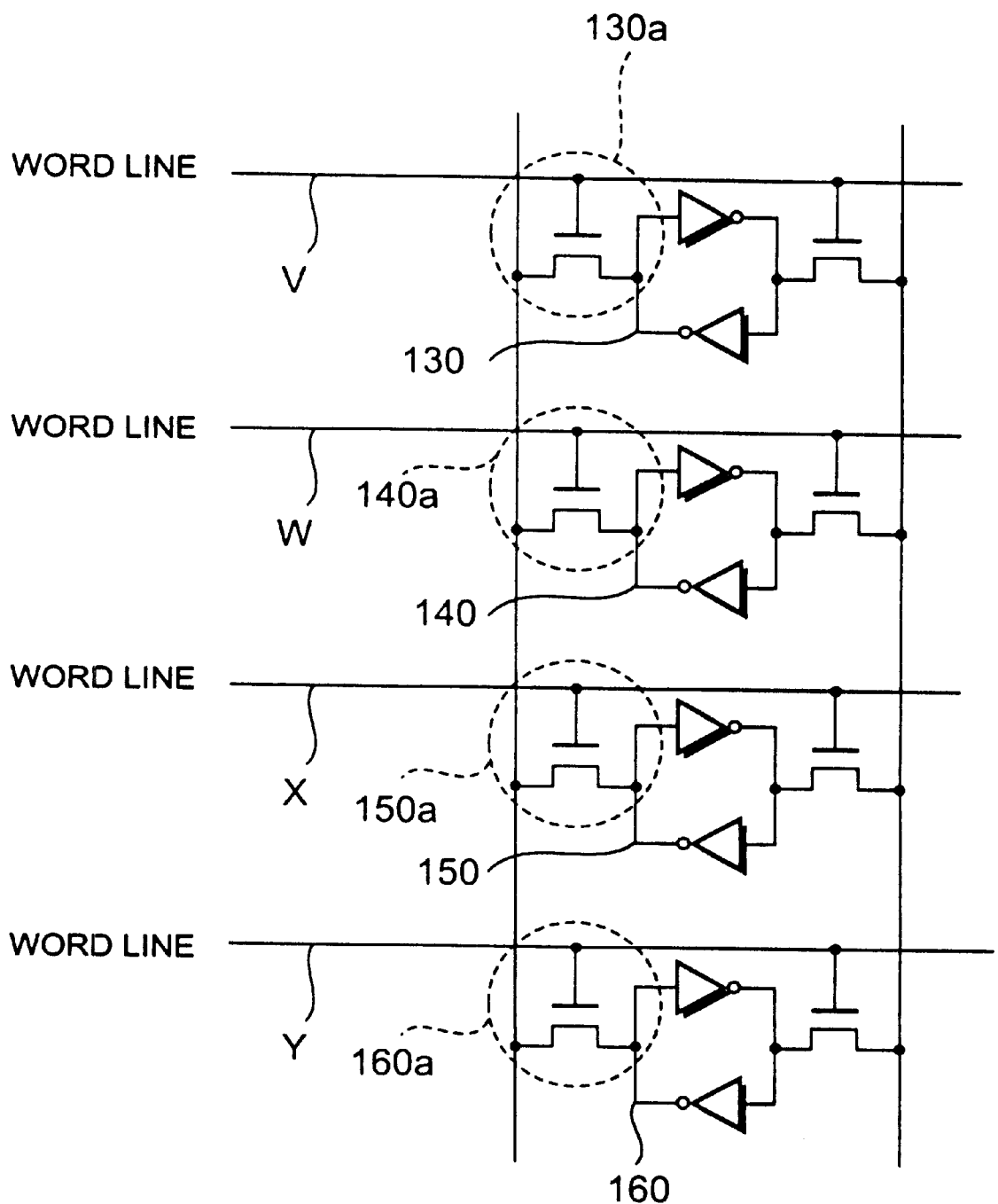
FIG. 6 is an explanatory view for explaining the mechanism of multiword.

According to a conventional circuit constitution shown by FIG. 5, the group U of signals corresponding to the signals D, E, D' and E' according to the present invention establish relationships of D≠E and D'≠E'.

That is, when the signal D is at "High" level, the signal E is at "Low" level and when the signal D is at "Low" level, the signal E is at "High" level and therefore, a logical circuit, for example, the gate 110a having three inputs is obliged to add for preventing the multiword.

Figure 2:
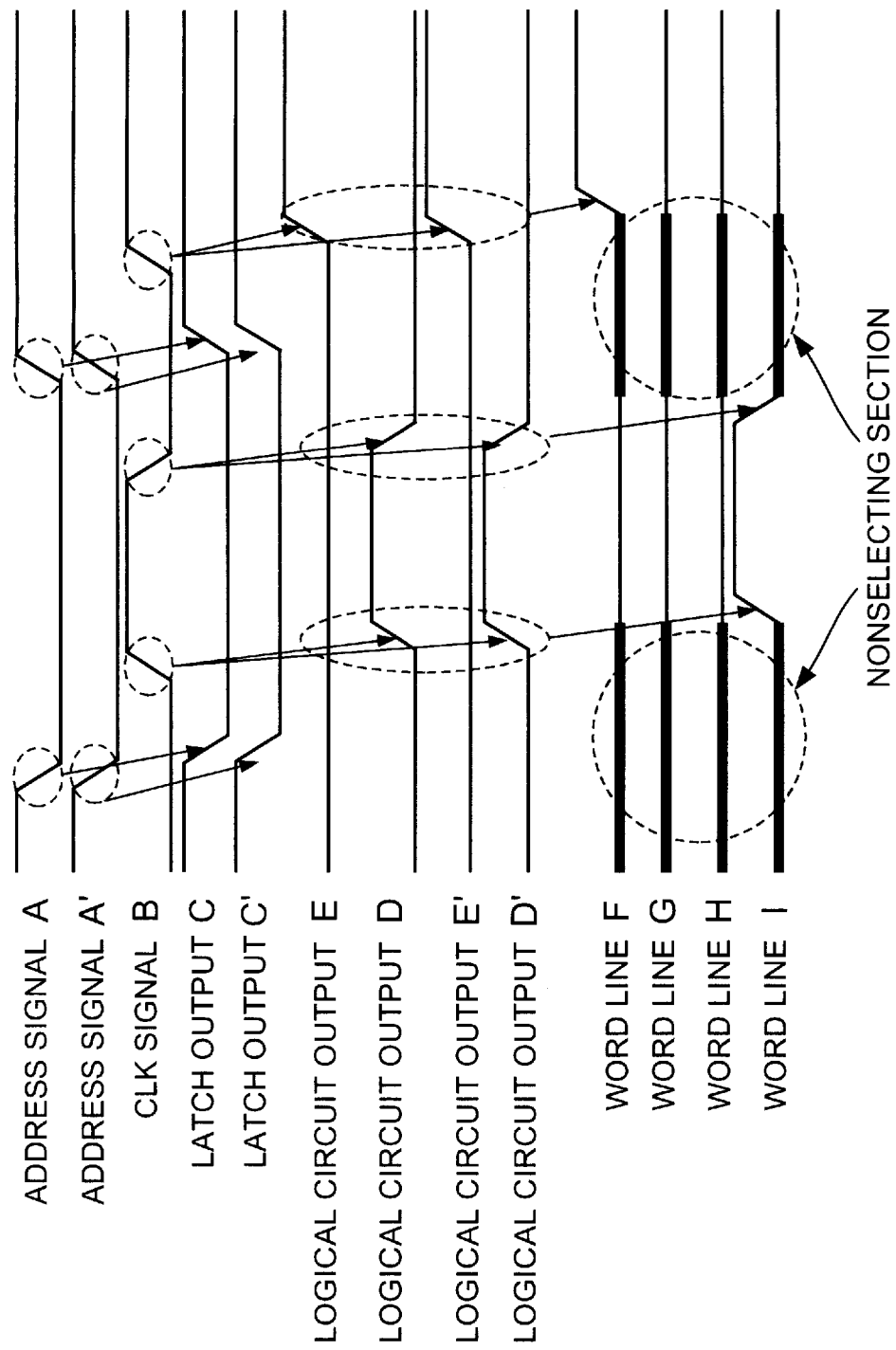
FIG. 2 is a waveform diagram showing operational timing.

However, according to the present invention, by integrating not only the relationships of D≠E and D'≠E' but also a logical constitution of establishing also relationships of D=E and D'=E', the multiword is prevented. This corresponds to a period in which the WORD lines F, G, H and I are not selected as shown by FIG. 2. During the time period in which the clock signal B is brought into "Low" level, the signals D, E, D' and E' are unconditionally initialized to "Low" level. That is, relationships of D=E, D'=E' and D=D' are established.

Further, according to the conventional constitution in which priority is given to the number of transistors shown by FIG. 5, setup time which is needed for reading or writing memory, is determined when the address signals S and S' and the clock signal T are brought into a temporal relationship of (arrival time of address signals S, S')<(arrival time of clock signal T) at the portion of the NAND gate 110a of the decoder 110, further, hold time is determined when the address signals S and S' and the clock signal T are brought into a temporal relationship of (arrival time of address signals S, S')>(arrival time of clock signal T) at the portion of the latch circuit 100.

In the meantime, according to the circuit constitution of the present invention, both setup time and hold time are determined by the latching circuits 13 and the logical circuits 14 at vicinities of input terminals thereof and accordingly, the timings are relatively earlier.

In FIG. 5, there is constructed a constitution in which the address signals S and S' are synchronized with the clock signal T at the latching circuits 100, the group U of output signals are decoded by the decoders 110 and in order to prevent the multiword, the output from the delay gate 120 delaying the clock signal T is connected to the NAND gates 110a of the decoders 110.

Therefore, the time at which the address signals S and S' arrive at the NAND gates 110a of the decoders 110 is retarded.

Therefore, the access time is deteriorated. Further, in setting the delay gate 120, the delay time is set to include a margin to some degree and accordingly, although a number of transistors is restrained to be small, the characteristic is deteriorated.

However, according to the circuit constitution of the present invention, by providing the logical circuits 14 in respect with the clock signal B immediately after the latching circuits 13, during the "Low" time period of the clock signal B, the logical circuit output signals D, E, D' and E' are unconditionally initialized to "Low" level. Therefore, the multiword is presented without transmitting the clock signal B to the NAND gates 15a constituting the decoders 15, further, a number of transistors constituting the NAND gate 15a is reduced.

Figure 3:
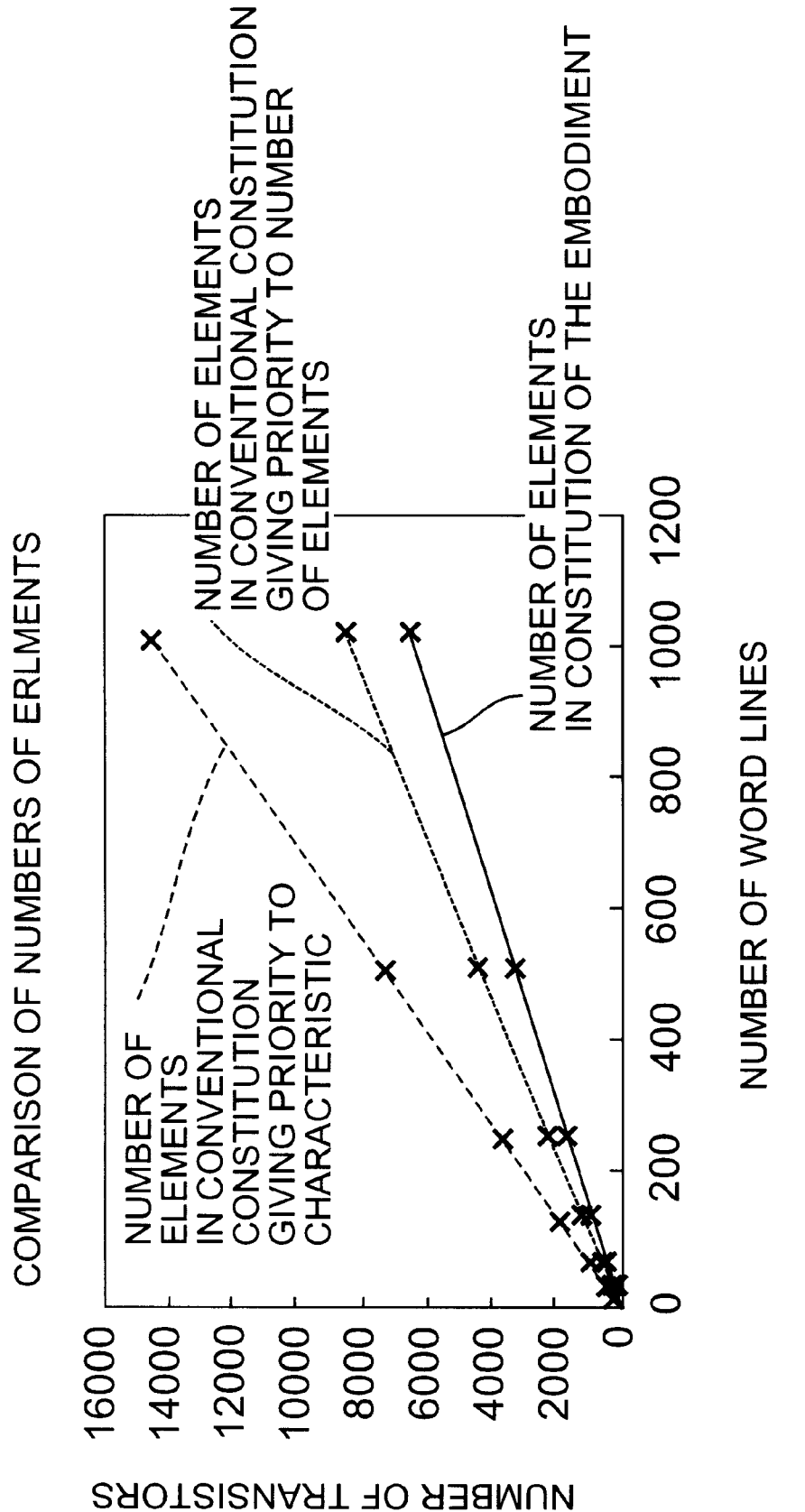
FIG. 3 is a graph for comparing numbers of transistors of a conventional circuit constitution and a circuit constitution of the present invention.

FIG. 3 is a graph comparing number of transistors in a conventional circuit constitution and in a circuit constitution of the present invention.

For example, in the case of 16 WORD of a small size memory capacity, according to the conventional circuit constitution shown by FIG. 5, 202 of transistors are needed, whereas according to the circuit constitution of the present invention, 194 of transistors can be sufficient.

In the case of 1024 WORD of a large size memory capacity, according to the conventional circuit constitution shown by FIG. 5, 8374 of transistors are needed, whereas according to the circuit constitution of the embodiment, 6386 of transistors can be sufficient.

When a number of transistors of a circuit for synchronizing address signals plus decoding unit in the conventional constitution giving priority to the number of transistors as shown by FIG. 5, is compared with a number of transistors of the circuit for synchronizing address signals plus decoding unit according to the circuit constitution of the present invention shown by FIG. 1. It is apparent that the number of transistors is constituted to be smaller in the case of the present invention.

Further, it is known that the larger the memory capacity, the more the number of transistors capable of being reduced increases.

Whereas naturally, the reduction in the number of transistors is apparent in the present invention, it is apparent in FIG. 1 that the driving capability is promoted with the same dimension size by reducing a number of inputs of the NAND gates provided to the decoders necessary for the number of the WORD lines in FIG. 5 and the access time can be made faster. Further, the load capacitance imposed to the clock signal can also be reduced according to the present invention and the access time can further be made faster.

Figure 7:
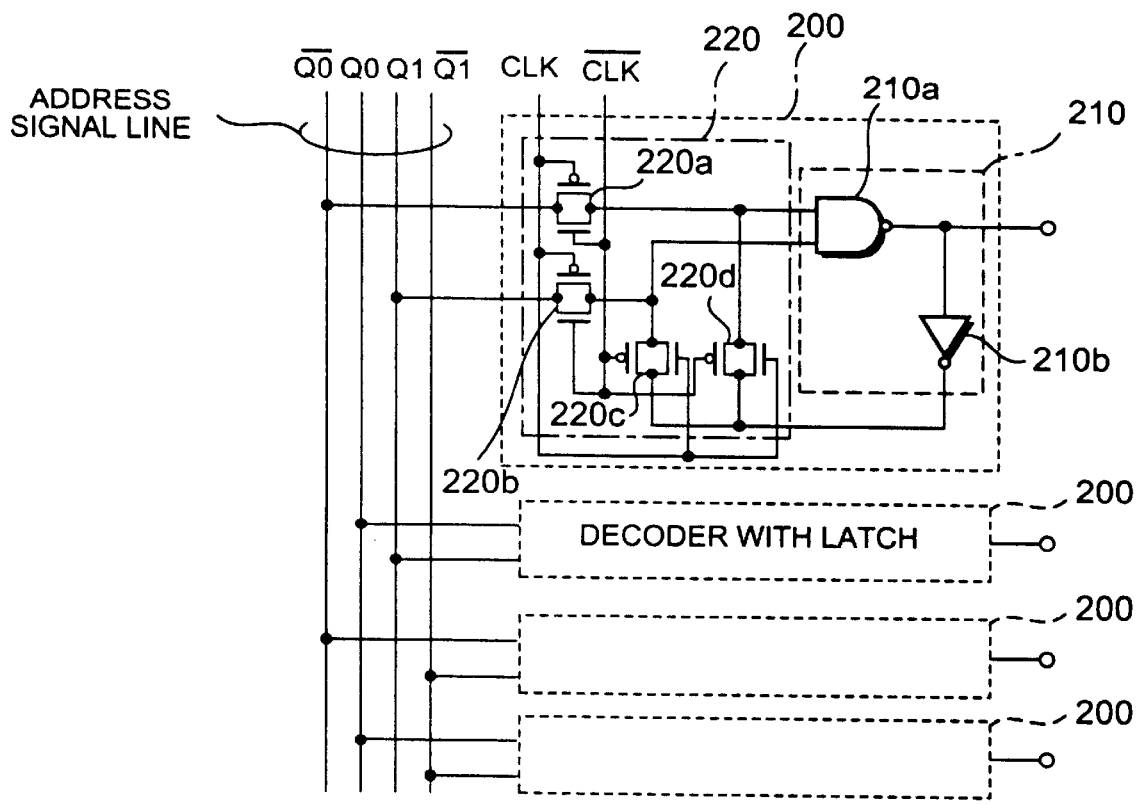
FIG. 7 is a block diagram showing a circuit constitution of other conventional example in which priority is given to the characteristic.

Next, conventionally, in designing a synchronous type SRAM giving priority to the characteristic, the constitution shown by FIG. 7 is used and accordingly, although high speed formation of the synchronous SRAM is realized, the larger the memory capacity, the more the number of transistors is increased since the decoder unit 210 and the latch unit 220 are integrated.

Further, when power supply is turned on, there is a case in which a plurality of the outputs from the NAND gates 210*a* are selected to be brought into "High" state, in the worst case, the large current flows until the clock signal is changed, there is the possibility that the transistors are broken. Accordingly, an initializing circuit needs to provide at the output portion of the NAND gate 210*a* to thereby constitute a factor of increasing the number of transistors.

In this case, an explanation will be given of a difference between the conventional circuit constitution and the circuit constitution of the present invention in reference to FIG. 1 and FIG. 5.

A stage number of transistors of the circuit constitution according to the embodiment shown by FIG. 1 is the same as that of the conventional circuit constitution shown by FIG. 5. That is, there is no increase in a gate stage number from the address signal to the WORD line in the circuit constitution of the present invention compared with that of the conventional circuit constitution giving priority to the number of transistors. Furthermore, according to the conventional circuit constitution, the margin of setting the Delay gate is added to the access time and accordingly, also in respect of the characteristic, the present invention is superior thereto.

Further, during the time period in which the clock signal B is brought into "Low" level, the logical circuit output signals D and E are unconditionally initialized to "Low" level and accordingly, there is no need of newly providing an initializing circuit and there is no need of intentionally installing outside terminals.

As has been explained, according to the present invention, there is achieved an effect of being capable of reducing the number of elements without being accompanied by a deterioration in the characteristic.

Figure 4:
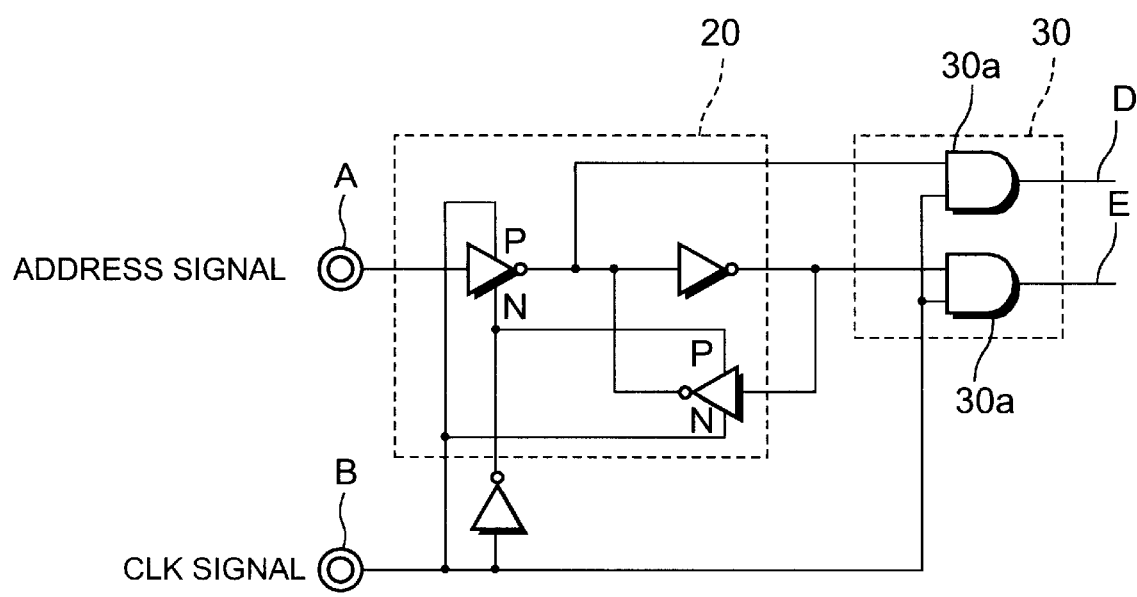
FIG. 4 is a block diagram showing a circuit constitution according to a modified example.

Although according to the present invention, the latching circuit and the logical circuit are constituted independently from each other, the latching circuit and the logical circuit can integrally be constituted as shown by FIG. 4.

That is, there can be constructed a circuit constitution in which the address signal A is inputted to a latch unit 20 during a time section in which the clock signal B is brought into "Low" level, the address signal A is latched during a time section in which the clock signal B is brought into "High" level, the clock signal B is transmitted to AND circuits 30*a* of a logical circuit unit 30 and the signals D and E are unconditionally brought into "Low" level during the time section in which the clock signal B is brought into "Low" level.

As has been explained the present invention can provide the address decoder capable of reducing the number of transistors without deteriorating the characteristic.

Further, the address decoder according to the present invention is applicable to a synchronous type static RAM provided to an integrated circuit for a specified use.

Further, the logical circuit can initialize a decoded signal outputted from a WORD line.

Further, the logical circuit can be constituted by a simple arrangement of transistors and accordingly, the constitution can be simplified.

Further, the multiword can be prevented by initializing a decoded signal in accordance with a change in the clock signal.

Further, by integrating the logical circuit with a surrounding circuit constitution, the constitution can be simplified.

While preferred embodiments of the present invention have been described, it is to be understood that the invention is to be defined by the appended claims when read in light of the specification and when accorded their full range of equivalent.

What is claimed is:

1. An address decoder for synchronous type memory comprising:

a logic circuit which receives an address signal and a clock signal, and outputs a first signal corresponding to said address signal during a first period and outputs an initialized signal during a second period different from said first period, and a decoding circuit which receives said first signal to drive a word line and receives said initialized signal to initialize said word line.

2. The decoder according to claim 1, said clock signal is at a first logic level during said first period and said clock signal is at a second logic level during said second period.

3. The decoder according to claim 2 further comprising:

a latch circuit which latches said address signal in response to said clock signal;

wherein said latch circuit connects to said logic circuit to transfer said address signal to said logic circuit.

4. The decoder according to claim 3, wherein said first logic level is a low level and said second logic level is a high level.

5. An address decoder comprising:

a plurality of address signal terminals;

a plurality of latch circuits each connected to the respective address signal terminals to receive the respective address signals and a clock signal terminal to receive a clock signal;

a plurality of logic circuits each connected to the respective latch circuits to output the respective logic circuit output signal and said clock signal terminal; and a plurality of decoding circuits connected to said logic circuits to select one of a plurality of word lines in response to said address signals;

wherein each said logic circuit renders the respective logic circuit output signal initialized in response to said clock signal.

6. The address decoder as claimed in claim 5, wherein each said logic circuits outputs said logic circuit output signal which is complementary when said clock signal has a first logic level and outputs said initialized logic circuit output signal when said clock signal has a second logic level.

7. The address decoder according to claim 6, wherein each of said logic circuits comprises:
- a first NOR circuit connected to said latch circuit and said clock signal terminal; and
- a second NOR circuit connected to said latch circuit through an inverter circuit and said clock signal terminal.

8. The address decoder according to claim 6, wherein each of said logic circuits includes:
- a first clocked inverter connected to said address signal terminal and supplied with a first clock signal;
- a inverter connected to said first clocked inverter;
- a second clocked inverter connected to said inverter with feeding back connection and supplied with an inverted first clock signal;
- a first NAND circuit connected to said first clocked inverter and supplied with said first clock signal; and
- a second NAND circuit connected to said inverter and supplied with said first clock signal.

9. An address decoder including:

a latch circuit receiving an address signal and a clock signal; and a logic circuit receiving an output signal from said latch circuit and clock signal, which outputs a first output signal at a first node and a second output signal at a second node which is complementary to said first output signal when said clock signal is at a first logic level, which outputs a third output signal at said first node and a fourth output signal at said second node, said fourth output signal having the same logical level with that of said third output signal when said clock signal is at a second logic level.

10. The address decoder as claimed in claim 9, wherein said logic circuit has:
- a first NOR circuit receiving said output signal from said latch circuit and said clock signal and connected to said first node; and
- a second NOR circuit receiving said inverted output signal from said latch circuit and said clock signal and connected to said second node.

11. The address decoder as claimed in claim 9, wherein said latch circuit outputs said first and second output signals when said clock signal is at said first logic level, and said logic circuit has a first gate which transfers said first output signal to said first node in response to said first logic level of said clock signal and quits transferring said first output signal to said first node in response to said second logic level of said clock signal, and a second gate which transfers said second output signal to said second node in response to said first logic level of said clock signal and quits transferring said second output signal to said second node in response to said second logic level of said clock signal.

12. The address decoder as claimed in claim 11, wherein said first and second gates are first and second NAND circuit, respectively.

* * * * *